United States Patent [19]

Kozaki et al.

[11] Patent Number: 5,691,078
[45] Date of Patent: Nov. 25, 1997

[54] REMAINING BATTERY CAPACITY METER AND METHOD FOR COMPUTING REMAINING CAPACITY

[75] Inventors: Minoru Kozaki; Toshihiko Yamazaki, both of Suwa, Japan

[73] Assignee: Seiko Epson Corporation, Tokyo, Japan

[21] Appl. No.: 561,242

[22] Filed: Nov. 21, 1995

[30] Foreign Application Priority Data

| Nov. 21, 1994 | [JP] | Japan | 6-286671 |
| Oct. 18, 1995 | [JP] | Japan | 7-269932 |

[51] Int. Cl.⁶ .......................... H01M 10/48; G01R 31/30
[52] U.S. Cl. .................................. 429/92; 320/48
[58] Field of Search ................. 429/90, 92; 320/48, 320/43; 324/425

[56] References Cited

U.S. PATENT DOCUMENTS

| 5,479,085 | 12/1995 | Honda et al. | 320/48 |
| 5,518,835 | 5/1996 | Simmonds | 429/90 |

FOREIGN PATENT DOCUMENTS

| 0 388 523 A2 | 9/1990 | European Pat. Off. . |
| WO 94 17425 | 8/1994 | European Pat. Off. . |
| 6-284503 | 10/1994 | Japan . |
| 7-11802 | 2/1995 | Japan . |

*Primary Examiner*—M. Nuzzolillo
*Attorney, Agent, or Firm*—Oliff & Berridge

[57] ABSTRACT

An inexpensive, high precision accumulation type remaining battery capacity meter and method are provided, whereby the remaining capacity of the battery is determined by computing an accumulated discharge value and is displayed in steps on a display unit. The meter includes a memory device with at least one data table relating the terminal voltage of a battery discharging at a predetermined discharge current or discharge power to the remaining capacity of the battery. The data table is used to correct the computed remaining capacity displayed on the display unit. Corrections are only made within a specified range so that abnormal change in the displayed capacity is prevented.

10 Claims, 12 Drawing Sheets

| Measured Battery Terminal Voltage (V) | Detected Remaining Capacity (Cr) |
|---|---|
| 49.29 ~ | 10 |
| 49.00 ~ 49.29 | 9 |
| 48.71 ~ 49.00 | 8 |
| 48.34 ~ 48.71 | 7 |
| 47.86 ~ 48.34 | 6 |
| 47.29 ~ 47.86 | 5 |
| 46.61 ~ 47.29 | 4 |
| 45.86 ~ 46.61 | 3 |
| 44.77 ~ 45.86 | 2 |
| 40.00 ~ 44.77 | 1 |
| ~ 40.00 | 0 |

FIG.5 ative battery capacity meter used to measure the remaining capacity of a battery used in various types of equipment, and to a method for computing the remaining capacity of the battery. In particular, the present invention is suitable for a battery used to provide power to run an electric car or the like.

REMAINING BATTERY CAPACITY METER AND METHOD FOR COMPUTING REMAINING CAPACITY

BACKGROUND OF THE INVENTION

1. Field of the Invention

The present invention relates to a remaining battery capacity meter used to measure the remaining capacity of a battery used in various types of equipment, and to a method for computing the remaining capacity of the battery. In particular, the present invention is suitable for a battery used to provide power to run an electric car or the like.

2. Description of Related Art

In general, open circuit voltage detection methods and accumulation methods are known representative methods for computing the remaining capacity in a battery.

The open circuit voltage detection method uses the fact that upon release of the load, the battery's terminal voltage changes in accordance with the capacity remaining in the battery. The method computes the remaining capacity directly from the terminal voltage using a correspondence table prepared beforehand which relates the remaining capacity to the terminal voltage at the time of releasing of the load.

The accumulation method computes the capacity remaining in the battery by continuously measuring the discharged current or power of the battery, so that the cumulative amount discharged from the battery is known. The accumulated measurement, or cumulative amount discharged from the battery, is then subtracted from the battery's initial capacity or capacity at the start of battery usage, to thereby obtain capacity remaining in the battery.

Various remaining battery capacity meters have been proposed and commercialized based upon these fundamental methods.

The open circuit voltage detection method requires that the battery terminal voltage be measured when the load is released, and is consequently unsuitable for applications in which there are few opportunities for the load to be released. Accordingly, when the battery discharge is continuous for a long period of time, for example when the battery is used to power an electric car, an accumulation type remaining battery capacity meter is used instead of an open circuit voltage type remaining battery capacity meter.

The accumulation type remaining battery capacity meter must accurately accumulate the battery discharge current or discharge power over a long period of time. Consequently, a high precision detection means is used in the accumulation type meter, thus increasing cost.

In addition, the accumulation type meter also presents the problem that when the value representing initial capacity of the battery is in error, in theory the error cannot be eliminated until the battery has been completely discharged. Furthermore, it is technologically difficult to accurately determine the battery's initial capacity. When the initial capacity is determined using an open circuit voltage detection method, for example, the battery open circuit voltage is unstable immediately following charge or discharge. Measurement errors caused by unstable voltage are therefore impossible to avoid.

SUMMARY OF THE INVENTION

In consideration of the foregoing, an objective of the present invention is to provide an inexpensive, high precision remaining battery capacity meter that uses the accumulation method to accurately determine a battery's remaining capacity.

The remaining battery capacity meter of the present invention computes the cumulative amount of electric current or electric power discharged from the battery, computes the presently remaining battery capacity, and displays the remaining battery capacity on a display unit.

In addition, the meter corrects the computed remaining battery capacity by measuring voltage at the battery's terminal when the discharge current is equal or similar to a predetermined discharge current value, using the measured voltage to look up a remaining battery capacity value from a pre-recorded table of data, and then using the value from the table to correct the displayed remaining battery capacity if necessary.

Consequently, the present invention overcomes the difficulties of the prior art by allowing control over accumulation of errors without an expensive, high precision detection circuit, through use of the correction process outlined above. Moreover, the remaining battery capacity meter displays the remaining battery capacity in such a way as to prevent abnormal changes in the displayed capacity, for example an increase in capacity during battery discharge, or an excessively rapid decrease in capacity during battery discharge.

Specifically, correction of the displayed capacity value is restricted to a range wherein the displayed value of the battery's remaining capacity does not change due to the correction, so that it is possible to prevent the correction from causing unnatural changes in the displayed value such as an increase, or a dramatic decrease, in the displayed value during discharge of the battery. In this way increases or decreases in the meter's displayed value consistently match increases or decreases in the battery's actual remaining capacity.

BRIEF DESCRIPTION OF THE DRAWINGS

The invention will be described in detail with reference to the following drawings in which like reference numerals refer to like elements and wherein:

FIG. 5 is a drawing showing a data table for determining the detected remaining capacity value Cr according to a measured battery terminal voltage V, in the first embodiment;

DETAILED DESCRIPTION OF PREFERRED EMBODIMENTS

The present invention will now be described in detail with reference to a first embodiment shown in FIGS. 1 through 10.

Figure 1:
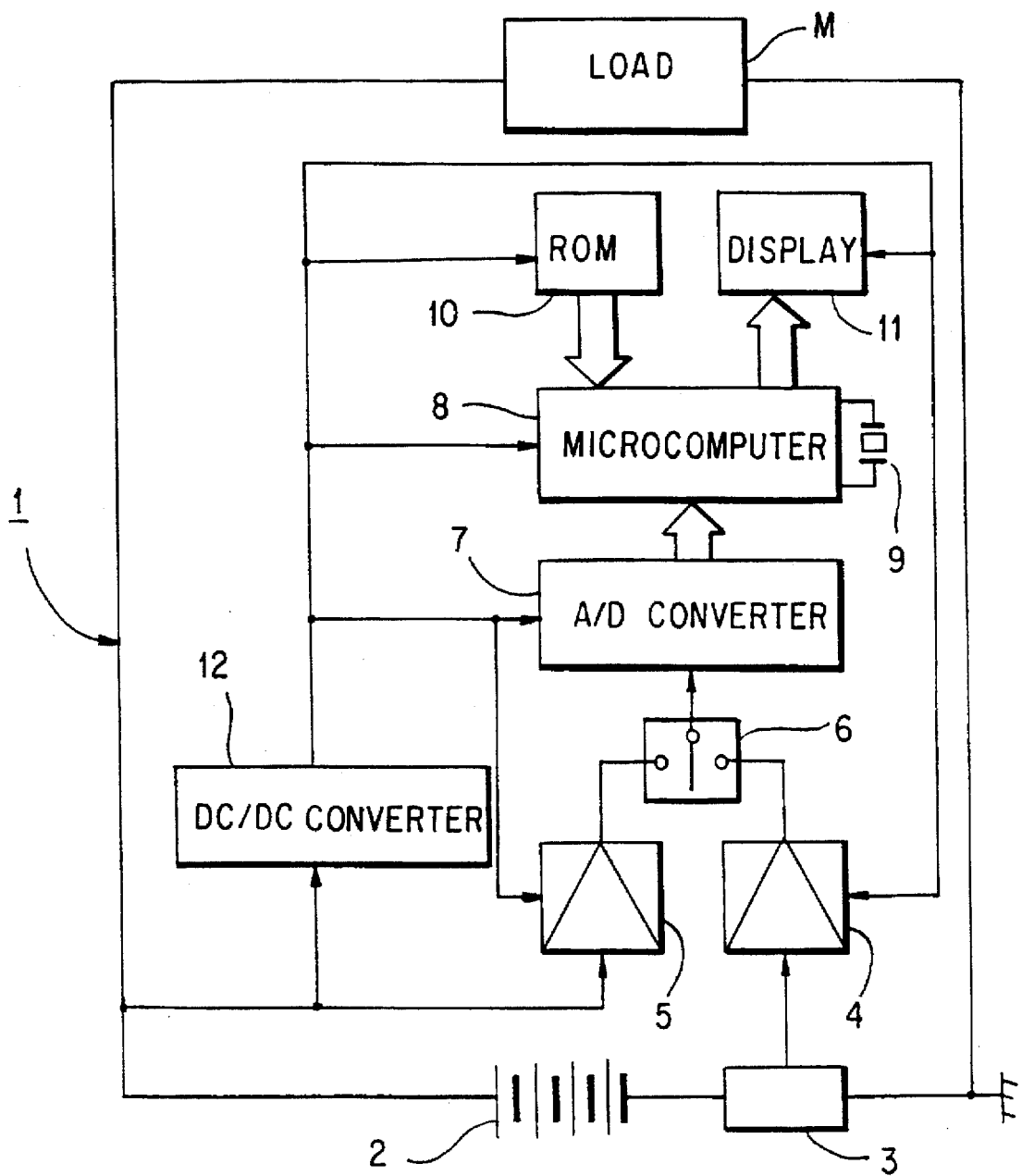
FIG. 1 is a system schematic drawing of a remaining battery capacity meter according to a first embodiment of the present invention.

As shown in the system structural diagram of FIG. 1, the remaining battery capacity meter 1 according to the present invention is composed of an electric current sensor 3 which is connected between the load M, such as an electric motor or the like, and the negative terminal of the battery 2 that is the object of measurement. An operational amplifier 4 is connected to the electric current sensor 3. An operational amplifier 5 is connected in parallel with the battery 2 and detects the battery terminal voltage. An analog multiplexer 6 alternatingly switches between the analog outputs of the operational amplifiers 4 and 5. An A/D converter 7 converts the analog output received from the analog multiplexer 6 into digital output. A microcomputer 8 is provided with a quartz oscillator 9 and a ROM (read-only memory) 10 and the like, and a display unit 11 is connected to the microcomputer 8. A DC/DC converter 12 supplies a predetermined driving current to each of the circuit groups.

In other words, a storage battery having a predetermined capacity is used as the battery 2, and supplies power to drive the load M for a sufficient time. The battery 2 is connected to, and charged by, a battery charger (not shown). In addition, where the battery is used in an electric vehicle, the battery is of such a type that it is possible to charge the battery during operation of the vehicle via, for example, a regenerative brake.

The electric current sensor 3 detects the battery discharge current, or current that flows from the battery 2 to the load M. The electric current sensor 3 converts the detected discharge current into an electric voltage signal that reflects the value of the discharge current, and the signal is output to the operational amplifier 4. Detection of the battery discharge current can be accomplished using either a method wherein a shunt resistor is connected in series with the battery, or a method wherein an electric current sensor employs a Hall element.

The operational amplifiers 4 and 5 respectively amplify signals representing the battery electric current value and battery terminal voltage, to voltages permissible for input to the A/D converter 7 through the analog multiplexer 6.

The analog multiplexer 6 selects between the outputs of the operational amplifiers 4 and 5 depending on command signals from the microcomputer 8, and passes the selected output to the A/D converter 7.

The A/D converter 7 digitizes the analog signal received from the multiplexer 6 and outputs the resulting digital signal to the microcomputer 8.

The microcomputer 8 is equipped with an input port for reading into memory the digital signals output from the A/D converter 7, and is connected to a ROM 10. According to the remaining battery capacity computation method of the first embodiment, the below-described accumulation type remaining battery capacity computation method is corrected according to a predetermined correction process using the present battery terminal voltage and programs and data tables stored in the microcomputer 8 and the ROM 10. The microcomputer 8 processes and corrects the digital signals received from the A/D converter 7, and the ROM 10 supplies various data and tables used in the processing and correction. A special quartz oscillator 9 connected to the microcomputer 8 supplies operational clock signals.

A display unit 11 connected to the microcomputer 8 displays a signal representing the corrected remaining battery capacity.

The cumulative electric current supplied by the battery can also be obtained through reverse computations from the present terminal voltage and the initial remaining battery capacity determined prior to commencement of current discharge from the battery. In this case, detection of the electric current unnecessary, and consequently, it is possible to omit the electric current sensor 3, the operational amplifier 4 and the analog multiplexer 6, thereby simplifying the circuitry of the remaining capacity meter 1.

Figure 2:
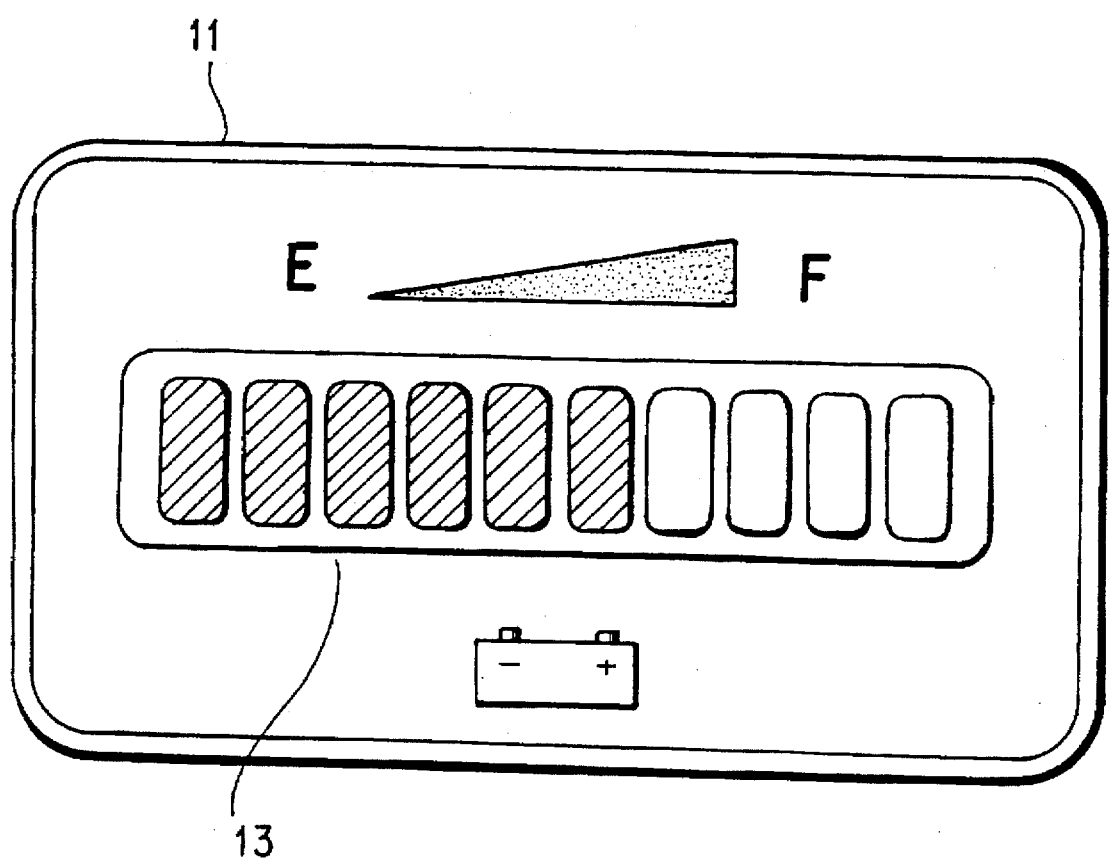
FIG. 2 is a frontal external view of the display unit of the remaining battery capacity meter according to the first embodiment.

The display unit 11 is mounted in a location on the remaining battery capacity meter where the user can easily view it. As shown in FIG. 2, an LED module 13 in which 10 LEDs (light-emitting diodes) are lined up in the horizontal direction, is positioned on the panel of the display unit 11. Furthermore, the number of lit LEDs increases or decreases in accordance with the display level number output from the microcomputer, so that the capacity presently remaining in the battery is clearly indicated to the user. In other words, when the battery is fully charged, all 10 LEDs are lit, and the number of lit LED's gradually decreases with the remaining battery capacity as the battery discharges. When the battery is fully discharged, all the LEDs are turned off. Accordingly, when six LEDs are lit, as in FIG. 2, the display unit 11 indicates that remaining capacity of the battery is at least 50% and less than 60% of the battery's initial capacity.

Furthermore, the method of display is not limited to increasing or decreasing the number of lit LEDs in the display unit 11, for a step display could also be used in which changes in the brightness or changes in color indicate remaining battery capacity. Alternatively, an analog voltage meter may be used instead of the LED display unit 11 to display the capacity remaining in the battery, by connecting a D/A converter to the microcomputer 8.

The DC/DC converter 12 supplies power to each of the circuit groups by reducing the battery supply voltage to a stable voltage at a level appropriate for the circuit groups, and distributing electric current to each of the circuit groups.

The method of computing the remaining battery capacity used in the remaining battery capacity meter 1 having the above structure is a method wherein a predetermined correction process using the remaining capacity detected from the terminal voltage is combined with the accumulation type remaining capacity detection method, thereby further boosting precision.

In other words, the method of the present embodiment indicates the ratio of the capacity presently remaining in the battery and available for discharge, to the total capacity that would be available for discharge if the battery were fully charged. In other words, when the battery is fully charged, all of the LEDs of the display unit 11 are lit, and the number of lit LEDs decreases to reflect diminished remaining battery capacity. The capacity remaining in the battery that is available for discharge is thereby indicated to the user.

Figure 3:
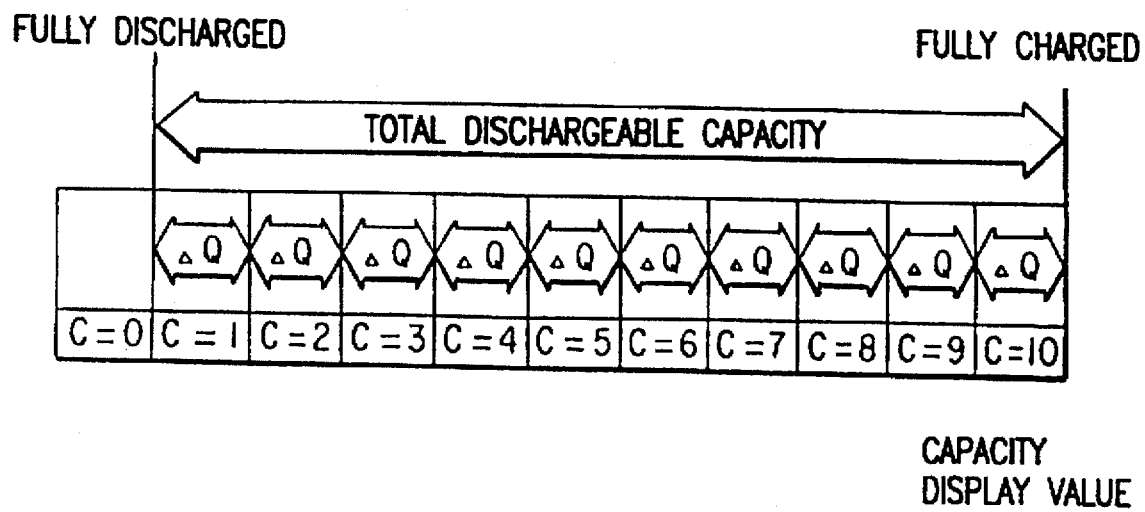
FIG. 3 is a drawing showing the relationship between the accumulated measurement of electric current discharged from the battery and the display increments of the first embodiment.

Accordingly, the capacity display value C which is used in internal computation processes in the present method is set to an integer from 0 to 10 for the 11 steps, in correspondence with the number of LEDs of the display unit as shown in FIG. 3, so that the capacity which can be completely discharged from the battery is divided equally into a plurality of intervals on the capacity axis. In other words, each value of C or each LED represents an interval, and the number of intervals corresponds to the maximum capacity display value. Each interval, therefore, represents a discrete amount of current discharged from the battery. Furthermore, when discharge usage of the battery first commences, the remaining capacity in the battery is estimated using an initializing process, and the capacity display value C is set according to the estimate so that the display indicates the estimated remaining battery capacity. Thereafter, as electric current is discharged from the battery, the capacity display value C is decreased as each interval is completed so that the display level is updated and corrected to accurately reflect capacity presently remaining in the battery.

The electric current accumulation method of the present embodiment computes the electric current which has been discharged from the battery, and determines whether an interval has been completed. If so, the capacity display value C is lowered by one step and the display is updated.

More specifically, the initial remaining capacity value of the battery is estimated using the initializing process when current discharge from the battery first commences. The display capacity value C is initially set based on the initial remaining capacity value, and the accumulated electric current value Q is set to an initial value. An interval total current value ΔQ indicates how much total current the battery will discharge during an interval. As the battery discharges current, the accumulated electric current value Q increases. When the accumulated electric current value Q matches the interval total current value ΔQ, then the interval is complete and the capacity display value C is changed to the capacity display value C of the next interval, the accumulated electric current value Q is reset, and the cycle begins again with respect to the new interval. Accordingly, the capacity display value C does not actually change until a complete interval's worth of current, ΔQ, has been discharged, even though the remaining battery capacity decreases continuously between interval completions. This process allows the below-described correction process of the present embodiment to be easily executed.

As described above, the capacity display value C used in the present embodiment is set to an integer value from 0 through 10 corresponding to the number of lit LEDs in the LED module 13, thereby creating a step display that allows a user to easily comprehend the presently remaining battery capacity. The electric current accumulation value Q is the amount of the discharged electric current accumulated from the start of discharge to the present time, for each display level interval. At predetermined time intervals T, the electric current I discharged from the power supply line of the battery is detected, the discharged electric current I is added to the electric current accumulation value Q of T seconds previous, and a new electric current accumulation value Q is computed.

The correction value which corrects this kind of accumulation process is generated during battery discharge using a detected remaining capacity value Cr which is determined from the terminal voltage when the battery current matches a predetermined current Ir or is in the proximity thereof.

Figure 4:
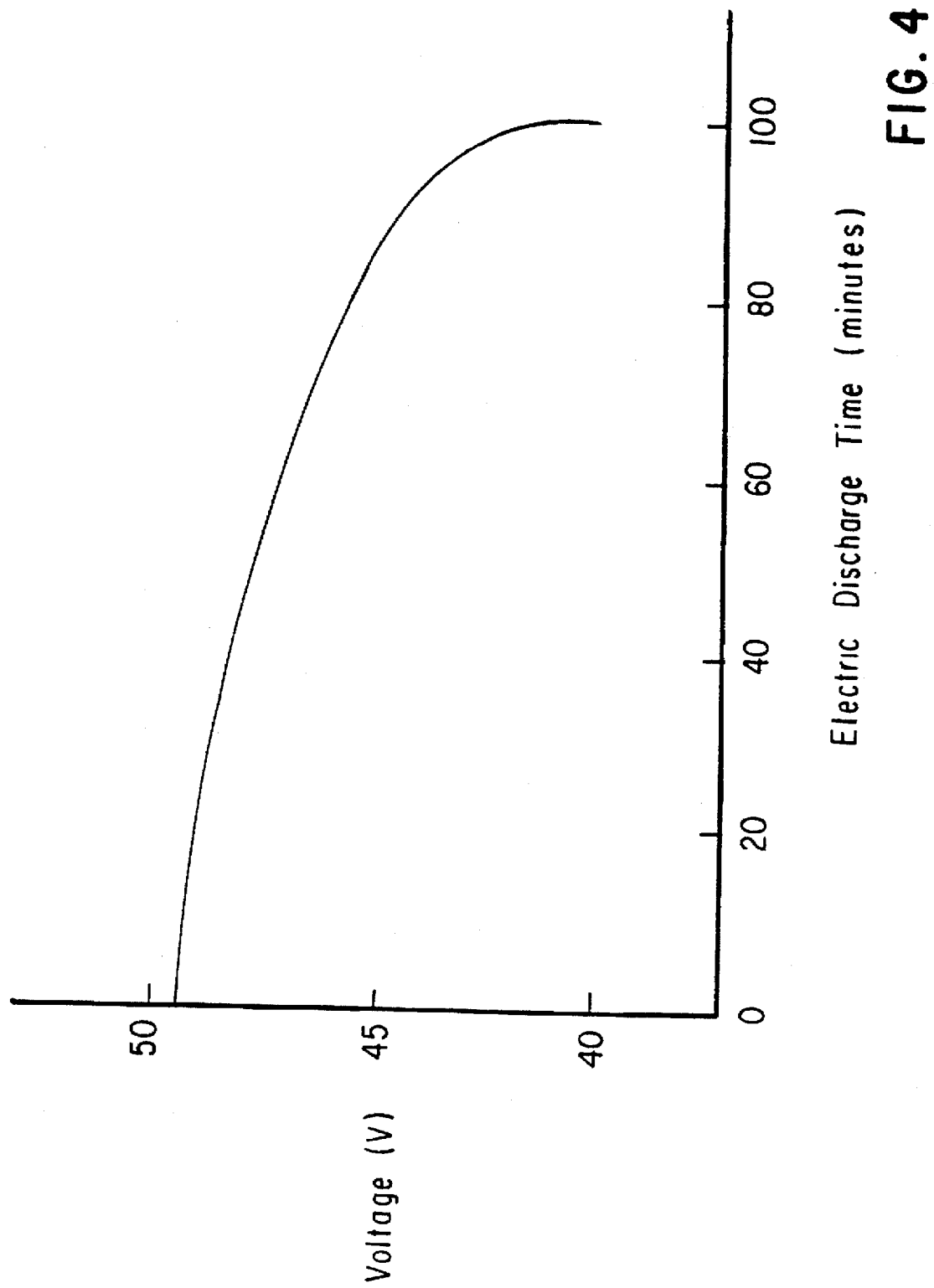
FIG. 4 is a drawing showing the relationship between time and battery terminal voltage at a fixed discharge current, of a general battery.

In other words, in general, when the battery is discharged at a fixed current, a terminal voltage change curve such as the one shown in FIG. 4 is observed. As shown in FIG. 4, as time elapses during battery discharge at a constant current level, the battery terminal voltage decreases gradually over most of the discharge time, and then decreases dramatically as discharge continues when the usable capacity of the battery has been mostly used up. In addition, the discharge curve is substantially the same for batteries of the same type, if operating conditions such as temperature and the like are the same. Accordingly, by calculating and storing this curve beforehand with respect to a specific discharge current of a certain battery, it is possible to determine the remaining capacity at a given time during discharge of the battery by detecting the value of the battery terminal voltage at the time when the battery discharge current matches the predetermined discharge value.

Therefore, in the present embodiment, it is possible to prepare beforehand the correlation between the battery terminal voltage V and the detected remaining capacity value Cr as a data table with respect to a specific discharge current Ir of the battery, as shown in FIG. 5. In other words, the data table is composed of rows for 11 levels including the 0 level in accordance with the display capacity value C. Each row thus divided lists a detected remaining capacity value Cr and a corresponding detected terminal voltage range V. Accordingly, the battery terminal voltage V of the battery 2 is detected and then used to look up the detected remaining capacity value Cr from the table when the detected electric current value I detected at this time approaches the specific electric current Ir.

In addition, by selecting the specific electric current Ir to be an electric current value at which the battery is most likely to be discharged, opportunities for using the terminal voltage V to determine the detected remaining capacity value Cr are increased, and the number of tables can be decreased. Accordingly, it becomes possible to efficiently determine the terminal detected remaining capacity value Cr from the terminal voltage V.

Furthermore, in the present embodiment the detected remaining capacity value Cr is used to correct the electric current accumulation value Q so that the accumulation value Q remains inside the range of the current display interval so that the presently remaining battery capacity is corrected without altering the capacity display value C, and thus dramatic changes in the remaining capacity display of the display unit 11 are prevented.

In other words, the electric current accumulation value Q is increased or decreased by an amount corresponding to k times the electric current accumulation value Q up to the boundary of the interval, where k is a correction coefficient which has a value less than 1 and is set to a value in the range $0<k<1$. Accordingly, the electric current accumulation value Q is constantly corrected through a correction coefficient k less than 1, and therefore the electric current accumulation value Q does not exceed the present display interval during the correction process. Accordingly, it is possible to avoid dramatic fluctuations in the remaining battery capacity display.

In the present embodiment, the remaining battery capacity meter 1 is used with a battery that supplies electrical power to a motor mounted in an electric vehicle. The above-described values are set to actual numbers as described below.

In other words, in an electric vehicle with an electric motor or the like, a battery, for example a sealed lead storage battery of 30 Ah actual capacity or nominal capacity, is mounted to provide power to the motor. Where the running speed which the vehicle normally uses is assumed to be 30 km/h and such factors as the weight of the vehicle and the motor output are taken into consideration, the specific electric current Ir is set at 15 A (amperes).

Where the total capacity of the battery is 30 Ah and the capacity display value partitions the whole into 10 steps, the change in one step becomes a discharge of 1/10 of 30 Ah, or 3 Ah, and the interval total current value ΔQ is set to 3 Ah. However, when the electric current accumulation time interval T is set to 0.5 seconds, the discharge electric current which is detected at each time interval is accumulated without conversion, and consequently, the interval total current value ΔQ is reset to a value found from the following equation:

$$\Delta Q = (3\ Ah)(1/0.5s)(60m/h)(60s/m) = 21600\ A \quad (1)$$

Accordingly, the interval total current value ΔQ is set to 21600 A. In addition, when the time interval T is set to 2 seconds, for example, ΔQ is set to 5400 A using the above equation.

In addition, the correction coefficient k which corrects the accumulated electric current value Q is set to 0.5.

Figure 6:
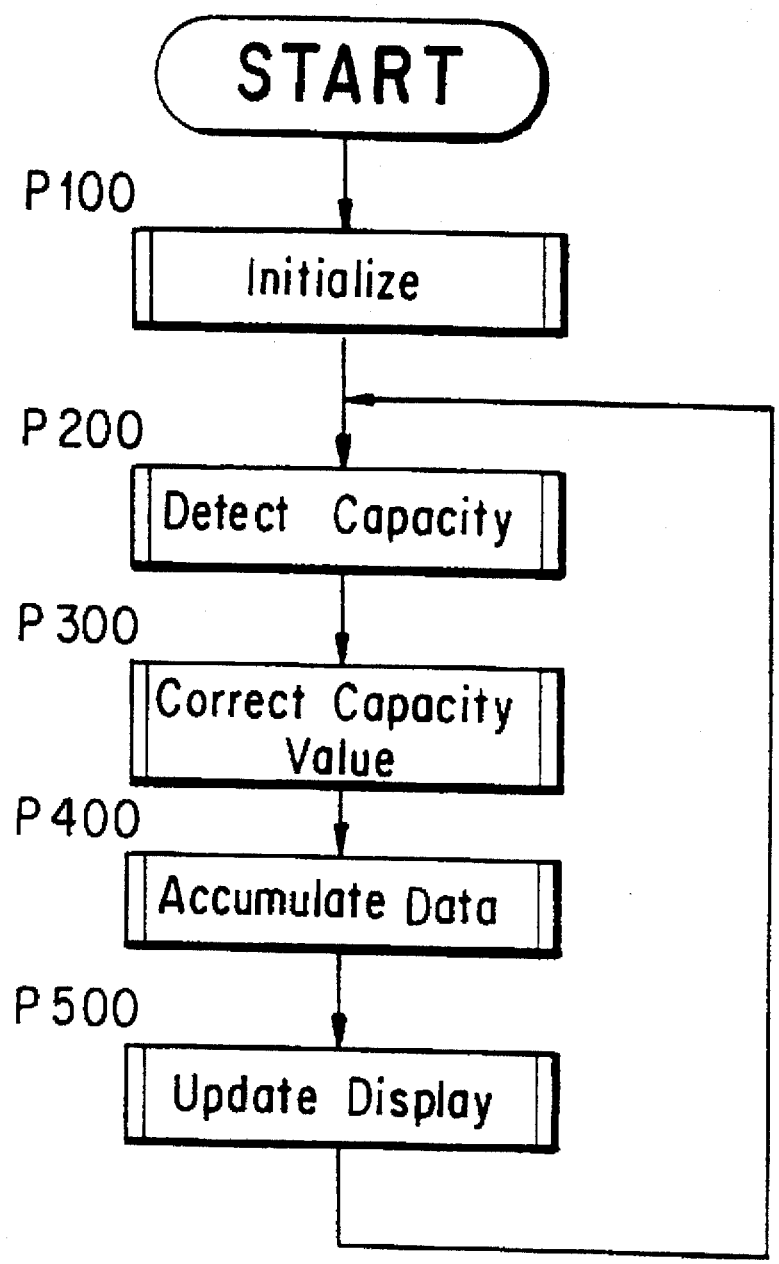
FIG. 6 is a flowchart outlining the remaining battery capacity computation method of the first embodiment.

Using each of the values thus set, the remaining capacity computation method in the remaining battery capacity meter 1 is executed through the flowchart shown in FIG. 6. In other words, the flowchart includes an initializing procedure P100 which sets the initial remaining capacity at the start of battery discharge; a detection procedure P200 which detects the terminal voltage V when the battery discharge electric current I approaches the specific electric current Ir, and determines the detected remaining capacity value Cr from the terminal voltage V with reference to the data table; a correction procedure P300 which compares the most recently determined detected remaining capacity value Cr and the display capacity value C at each predetermined interval, and corrects the electric current accumulation value Q using a correction coefficient k; a usual accumulation procedure P400 which adds the detected electric current I to the electric current accumulation value Q; and an update procedure P500 which determines through the accumulation process whether or not the accumulated electric current value Q has exceeded the interval total current value ΔQ, and appropriately resets the display capacity value C to the next interval and resets the accumulated electric current value Q. The series of processes from P200 through P500 are repeated depending on the operation of the device.

Figure 7:
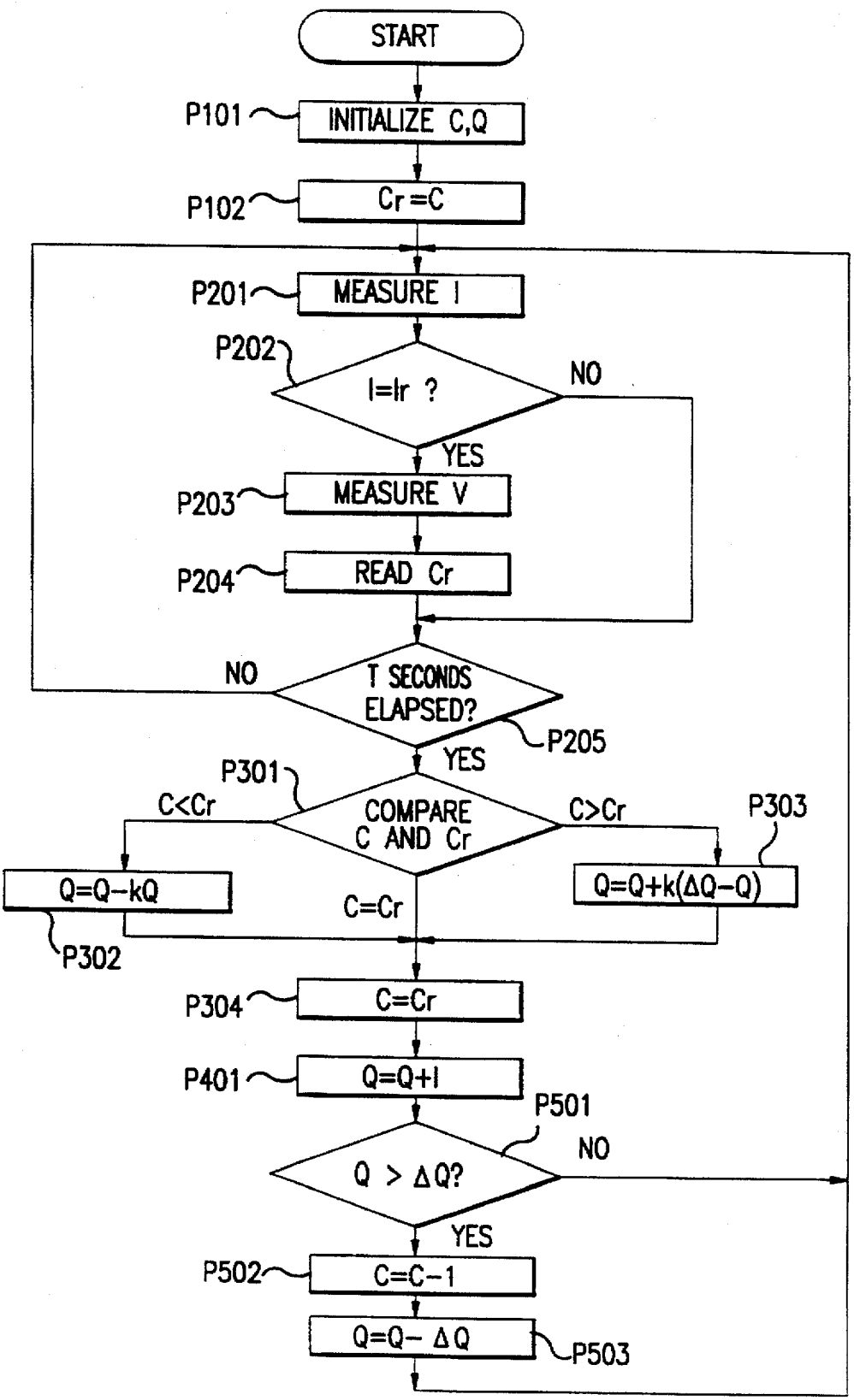
FIG. 7 is a flowchart showing computation steps of the remaining battery capacity computation method of the first embodiment.

Details of each process are shown in the flowchart of FIG. 7. In the flowchart, the initializing procedure P100 comprises steps P101 through P102, the detection procedure P200 comprises steps P201 through P205, the correction procedure P300 comprises steps P301 through P304, the accumulation operation procedure P400 comprises step P401 and the reset procedure P500 comprises steps P501 through P503.

Prior to commencement of any battery discharge, step P101 is executed and initial values of the capacity display value C and the electric current accumulation value Q are set. The initializing process estimates the initial remaining capacity at the start of battery discharge using an existing method of open circuit voltage detection, based on the fact that the terminal voltage changes in accordance with the remaining capacity on condition that the load on the battery is released. The capacity display value C and the current accumulation value Q are set on the basis of the initial remaining battery capacity. When the battery is not fully charged or changed, the values of the capacity display value C and the electric current accumulation value Q may be initialized using values stored in the memory of the microcomputer 8 from the time previous usage of the battery was completed. For example, when a user resumes operation of an electrically powered vehicle after a period of disuse without recharging or changing the battery. In addition, as further described below with respect to the first embodiment, even when an initializing process is inaccurate, the remaining battery capacity value will be corrected during the operation of the device incorporating the battery and the remaining battery capacity meter 1. Consequently, the precision and reliability of the remaining battery capacity meter 1 are preserved. Furthermore, simultaneous with the setting of the values of the capacity display value C and the electric current accumulation value Q, the specific electric current value Ir is set to 15 A, the time interval T is set to 0.5 seconds, the correction coefficient k is set to 0.5 and ΔQ is set to 21600 A.

Next, in step P102, the detected remaining capacity value Cr is set to a value which agrees with the capacity display value C, which has already been set. Through below-described steps P201 through P204, the correction process is not conducted as long as a new detected remaining capacity value Cr is not set.

In addition, in step P201, the discharge current of the battery 2 is measured by the electric current sensor 3, and the measured electric current value I is read by the microcomputer 8.

Furthermore, in step P202, the specific electric current value Ir and the detected electric current value I are compared, and when it is determined that the detected electric current value I is sufficiently close to the specific electric current value Ir, the flowchart proceeds to the processes in steps P203 through P204. If this determination is not made, the flowchart skips these steps and moves to step P205.

In step P203, the terminal voltage V of the battery is determined, and the battery terminal voltage V is read by the microcomputer 8.

Next, in step P204, the detected remaining capacity value Cr at this time is reset with reference to the data table described above, on the basis of the measured battery terminal voltage V. For example, when the terminal voltage value is 47.5 V, it is possible to determine through use of the table that the detected remaining capacity value Cr is level 5.

Next, in step P205, a determination is made as to whether or not a predetermined time interval of T seconds has elapsed. If T seconds have not elapsed, the flowchart returns to step P201, and the detection processes from step P201 through step P204 are repeated. If T seconds have elapsed, then the flowchart moves to the correction processes from step P301 on. Accordingly, until the time interval of T seconds elapses, the setting procedure for the detected remaining capacity value Cr is repeated on the basis of the battery terminal voltage V when the battery discharge electric current is the same as the specific electric current Ir. Consequently, to the extent possible, the detection capacity value Cr is reset to a most recent value.

The time count for the time interval T seconds is conducted through a timer process on the basis of the quartz oscillator 9 which is housed in the microcomputer 8.

Accordingly, when the timer recognizes that T seconds have elapsed, the discharge electric current I of the T second interval is added to the accumulated electric current value Q and the presently remaining battery capacity is computed by subtracting the accumulated, discharged electric current from the initial capacity. Furthermore, in the remaining battery capacity meter 1 of the present embodiment, when the most recently detected remaining capacity value Cr does not match the capacity display value C, a correction is added to the accumulated electric current value Q on the basis of the detected remaining capacity value Cr. However, in the correction process, correction is conducted only on the accumulated electric current value Q in the range where the value of the capacity display value C does not change. The correction is made using the correction coefficient k, which is set less than 1, without directly correcting the capacity display value C, thereby preventing the display on the display unit 11 from changing dramatically and becoming unstable.

In other words, in step P301 the capacity display value C and the detected remaining capacity value Cr are compared, and the flowchart branches in three directions depending on the results of this comparison.

Figure 8:
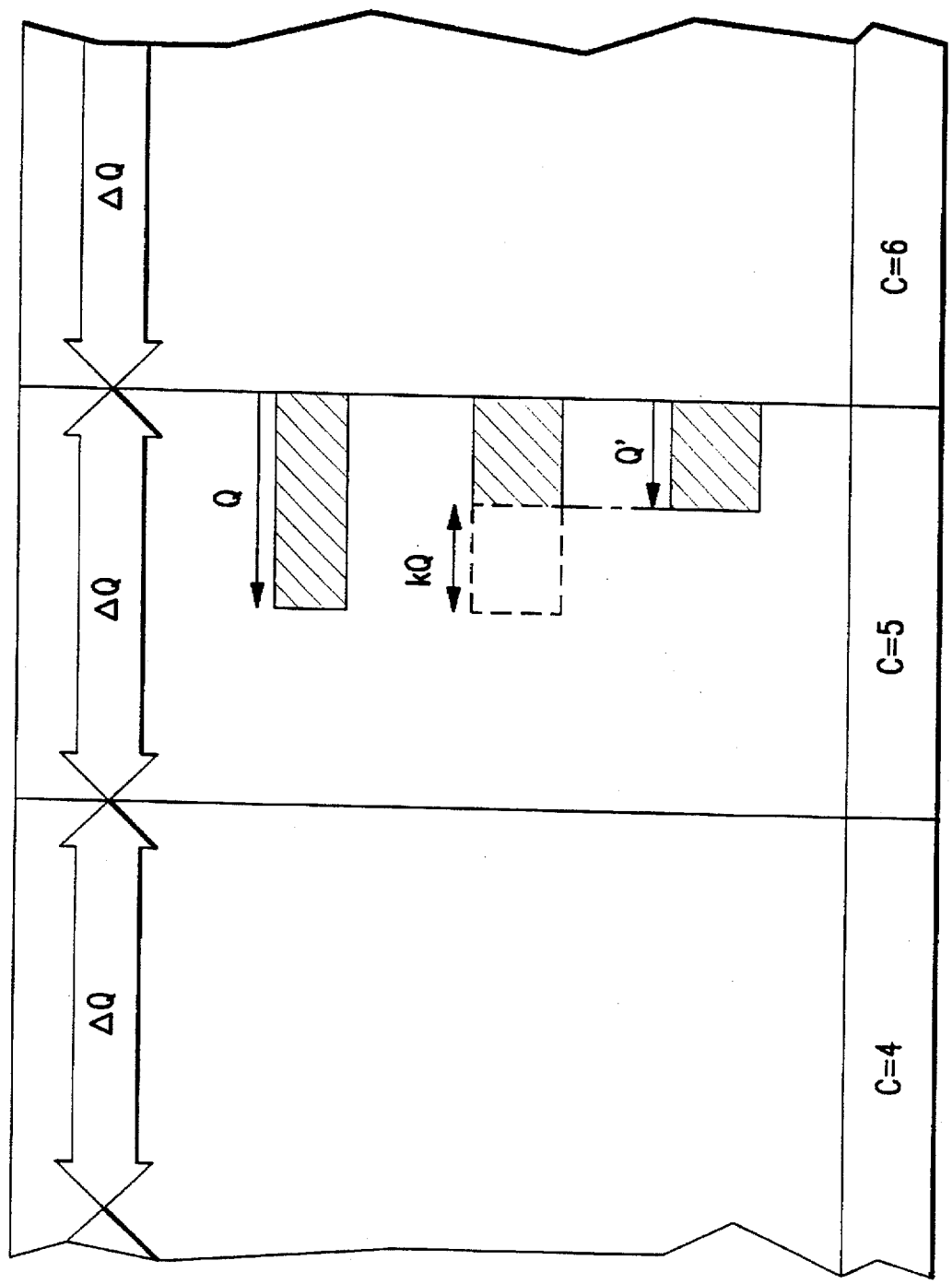
FIG. 8 is an explanatory drawing showing negative correction of the accumulated electric current value in the first embodiment.

Furthermore, when it is determined that the capacity display value C is smaller than the detected remaining capacity value Cr, the flowchart moves to step P302 and the electric current accumulation value Q is caused to decrease by an amount (k * Q), which corresponds to a percentage of Q. In other words, in the step P302, when for example the capacity display value C is 5 and the detected remaining capacity value Cr is 6 to 10, the amount (k * Q), which corresponds to the percentage of Q and which is indicated by the broken line in FIG. 8, is subtracted from the electric current accumulation value Q within the range of the fifth display level interval as shown on the top level of FIG. 8. The result is the electric current accumulation value Q' which has been corrected to be closer to the detected remaining capacity value Cr, as shown by the bottom level of the FIG. 8. In addition, the electric current accumulation value Q', which has undergone the correction process, is kept within the range of the fifth display level interval, regardless of the magnitude of the separation between the capacity display value C and the detected remaining capacity value Cr.

Accordingly, the electric current accumulation value Q itself remains in the same capacity display value C interval range even if the value Q is changed, and so the capacity display value C does not need to be changed. Dramatic change in the remaining battery capacity displayed by the display unit 11 is therefore prevented.

In addition, in the systems in which this kind of correction is not conducted, if there is a large difference between the remaining capacity value C, and the detected remaining capacity value Cr, which is estimated from the terminal voltage, an unstable display occurs. When the unstable display occurs, it becomes impossible for the user to accurately know the charge condition of the battery. For example, while the electric vehicle is running, a capacity level of 5 is displayed one minute previous, and at the present time, the display rapidly becomes that of level 2 or level 3. The driver is thereby given the impression that in one more minute the level will approach 0, and that operation of the vehicle will shortly become impossible. In contrast, with the present invention, the display of level 2 or level 3 is conducted in the end, but because a fixed and gradual display change is conducted that passes in steps through intermediate displays, it is possible to avoid dramatic changes in the displayed battery capacity which might confuse the driver.

In addition, in step P301, when the capacity display value C and the detected remaining capacity value Cr are determined to be equal, the flowchart moves to step P304 and the correction process is not conducted.

Furthermore, when in step P301 the capacity display value C is determined to be larger than Cr, the flowchart moves to step P303, and the electric current accumulation value Q is increased by k(ΔQ−Q), which is a fraction of the difference created by subtracting Q from the interval total current value ΔQ.

Figure 9:
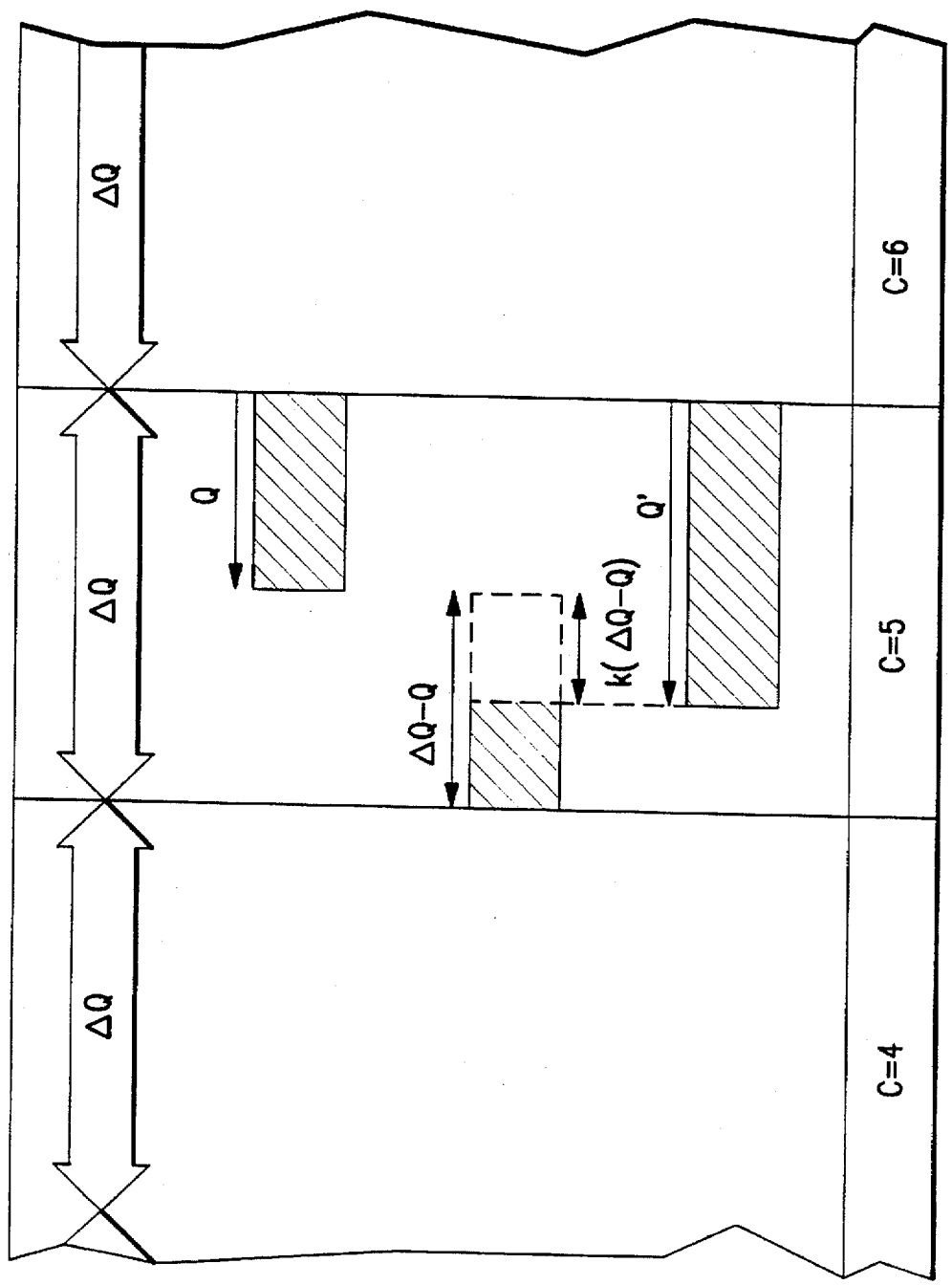
FIG. 9 is an explanatory drawing showing positive correction of the accumulated electric current value in the first embodiment.

In other words, in step P303, the value k(ΔQ−Q), which is a fraction of the difference between the electric current accumulation value Q and the interval total current value ΔQ as shown by the broken line in FIG. 9, is added to the electric current accumulation value Q within the range of the fifth display level interval, as shown in the top level of FIG. 9. Thereby, this value becomes an electric current accumulation value Q' that is corrected to be closer to Cr, as shown in the bottom level of FIG. 9. In addition, in this case, the electric current accumulation value Q' is kept within the range of the fifth display level interval similar to step P302 above, regardless of the magnitude of separation between C and Cr.

Accordingly, the electric current accumulation value Q itself remains in the same capacity display value C interval range even if this value Q is changed, the capacity display value C does not need to be changed, and the remaining battery capacity displayed by the display unit can be prevented from changing dramatically.

Regardless of the execution or non-execution of these increasing or decreasing corrections, in step P304 the detected remaining capacity value Cr is set equal to the capacity display value C, and unnecessary correction processes are thus not conducted.

Next, in step P401, the usual accumulation operation of the used electric current is conducted, and the detected electric current value I is added to the electric current accumulation value Q.

Moreover, in step P501 the electric current accumulation value Q is compared with the interval total current value ΔQ, and if the electric current accumulation value Q is less than the interval total current value ΔQ, adjustment of the capacity display value C is not conducted and the flowchart moves to step P201, following which the processes from step P201 are repeated. On the other hand, if the electric current accumulation value Q exceeds the interval total current value ΔQ, the flowchart moves to the resetting process of steps P502 and P503.

In other words, when it is determined that the electric current accumulation value Q has exceeded the interval total current value ΔQ, then in step P502 the capacity display value C is decreased by one level. In step P503 the interval total current value ΔQ is subtracted from the electric current accumulation value Q, so that a new electric current accumulation value Q is set for use in the next display level interval. Beginning with step P201, the accumulation process of the detected electric current I is conducted with respect to the new electric current accumulation value Q in the next display level interval.

Figure 10:
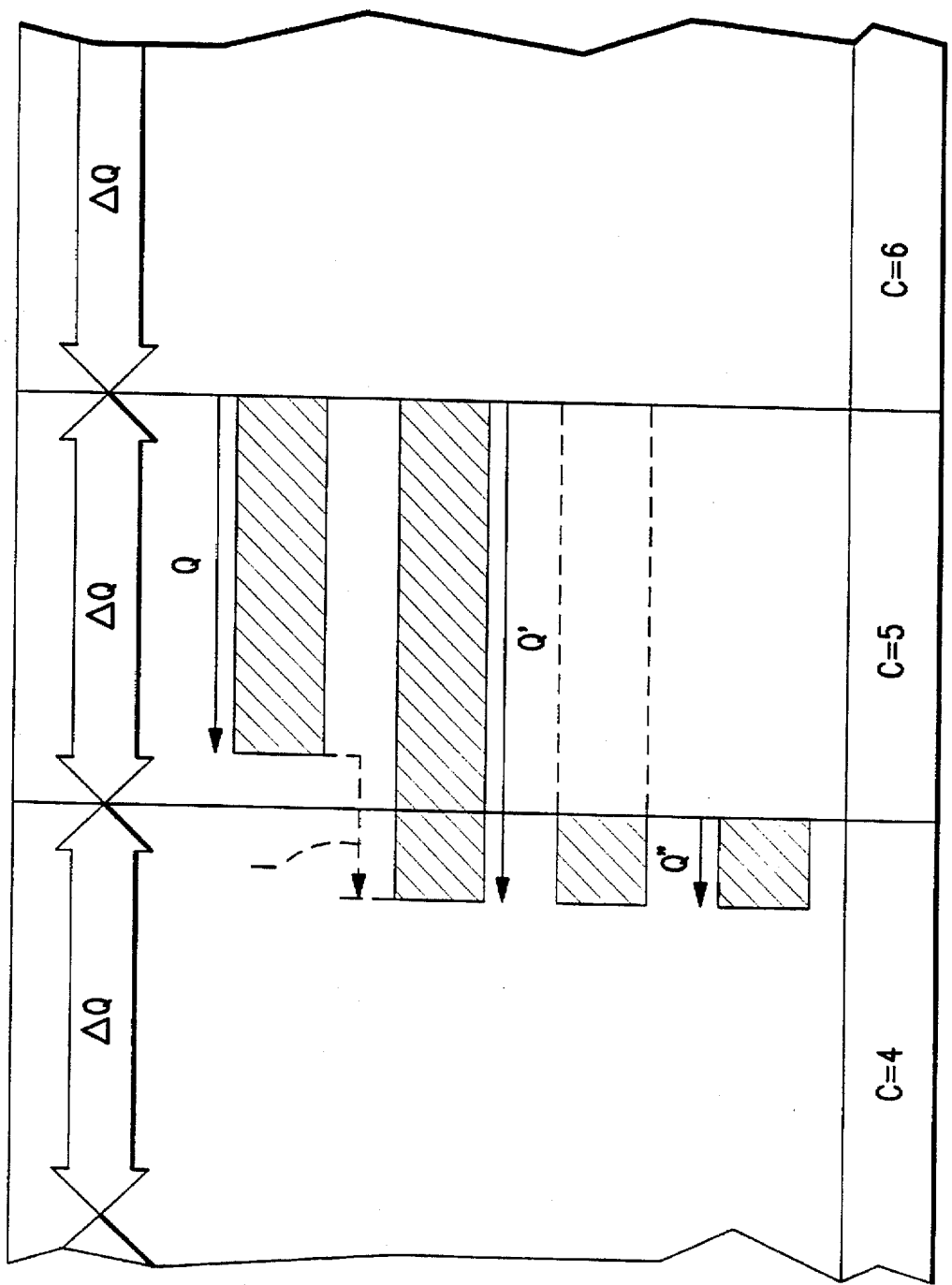
FIG. 10 is an explanatory drawing showing the display update process through the battery electric current accumulation operation of the first embodiment.

For example, as shown in the top level of FIG. 10, the electric current accumulation value Q in the fifth display level interval is increased by the electric current value I indicated by the broken line in the figure, and thereby becomes an electric current accumulation value Q' which exceeds the interval total current value ΔQ as indicated by the middle level in FIG. 10. The accumulation value position of the electric current accumulation value Q' crosses the interval boundary and enters the fourth display level interval (corresponding to the state when step P401 is completed). Thus, this state is determined in step P501, and in step P502, the capacity display value C is decreased by one level, and the display level drops from 5 to 4. Next, in step P503, the interval total current value ΔQ, which is the portion within the previous fifth display level interval, is subtracted from the electric current accumulation value Q' as shown in the bottom level of the figure, and a new electric current accumulation value Q" within the fourth display level interval is set.

Furthermore, when step P503 is concluded, the flowchart returns to step P201 and the series of processes from step P201 on are again repeated.

This kind of operation is repeated as long as the battery performs discharge operations, and the battery capacity display value C decreases as suitable corrections are applied during the battery discharge operations. In other words, the number of LEDs lit in the LED module 13 of the display unit 11 gradually decreases in agreement with the changes in the capacity display value C.

As described above, with the remaining battery capacity meter of the first embodiment, a data table which correlates the battery terminal voltage V and the detected remaining capacity value Cr is prepared beforehand with respect to a specific electric current value Ir in accordance with the discharge characteristics of the battery. When the battery discharge electric current matches the specific value or is in the proximity thereof, the remaining battery capacity recorded in the data table is read in accordance with the present value of the terminal voltage. A correction is conducted on the accumulated amount of the electric current within a range where the display value of the display unit at the present time does not change. Accordingly, dramatic decline of the displayed remaining battery capacity and increase of the displayed remaining battery capacity during discharge can be avoided, and increases or decreases in the indicated value can be made to match increases or decreases in the actual remaining capacity of the battery until the battery capacity is exhausted. In addition, the correction process allows control of accumulated errors in the remaining battery capacity meter even when the precision of the detection circuit and of the initializing process that sets the remaining capacity at the start of battery discharge is not high. Consequently, it is possible to secure high reliability while maintaining the merits of the accumulation type remaining battery capacity meter.

The present invention will now be described in detail with respect to a second embodiment shown in FIGS. 11 and 12. As with the first embodiment, the second embodiment will be described using an example applied to an electric vehicle, and each of the setting values will be the same as in the first embodiment.

The remaining battery capacity meter of the present embodiment is one which is useful not only for the battery discharge operation but also the charging operation during operation of the device using the battery.

For example, in an electric car which uses the battery as the driving source, a regenerative brake is used. The regenerative brake operates the motor in a power generating mode, and thus converts the kinetic energy that would otherwise be discarded during deceleration of the vehicle, into electrical energy which is used to recharge the battery.

In the above-described first embodiment, even if the influx of electric current to the battery through this kind of regenerative brake is not detected, the change in battery charge is naturally accounted for when the accumulation value Q is corrected. However, the indicated value of the remaining battery capacity meter 1 only decreases one by one. Accordingly, the correction operation controls the decrease in the indicated remaining battery capacity value when the battery is recharged during regenerative braking, but the indicated value does not increase. This process remains reasonably accurate if the influx of electric current from the regenerative brake occurs for a relatively short time. However, when the vehicle descends a long incline, for example, and the regenerative brake operates to charge the battery for an extended period of time, and if a significant increase in the remaining battery capacity is expected, then it is desirable to allow the indicated value of the remaining battery capacity to rise, and to thus clearly inform the driver of the increase in remaining battery capacity.

Figure 11:
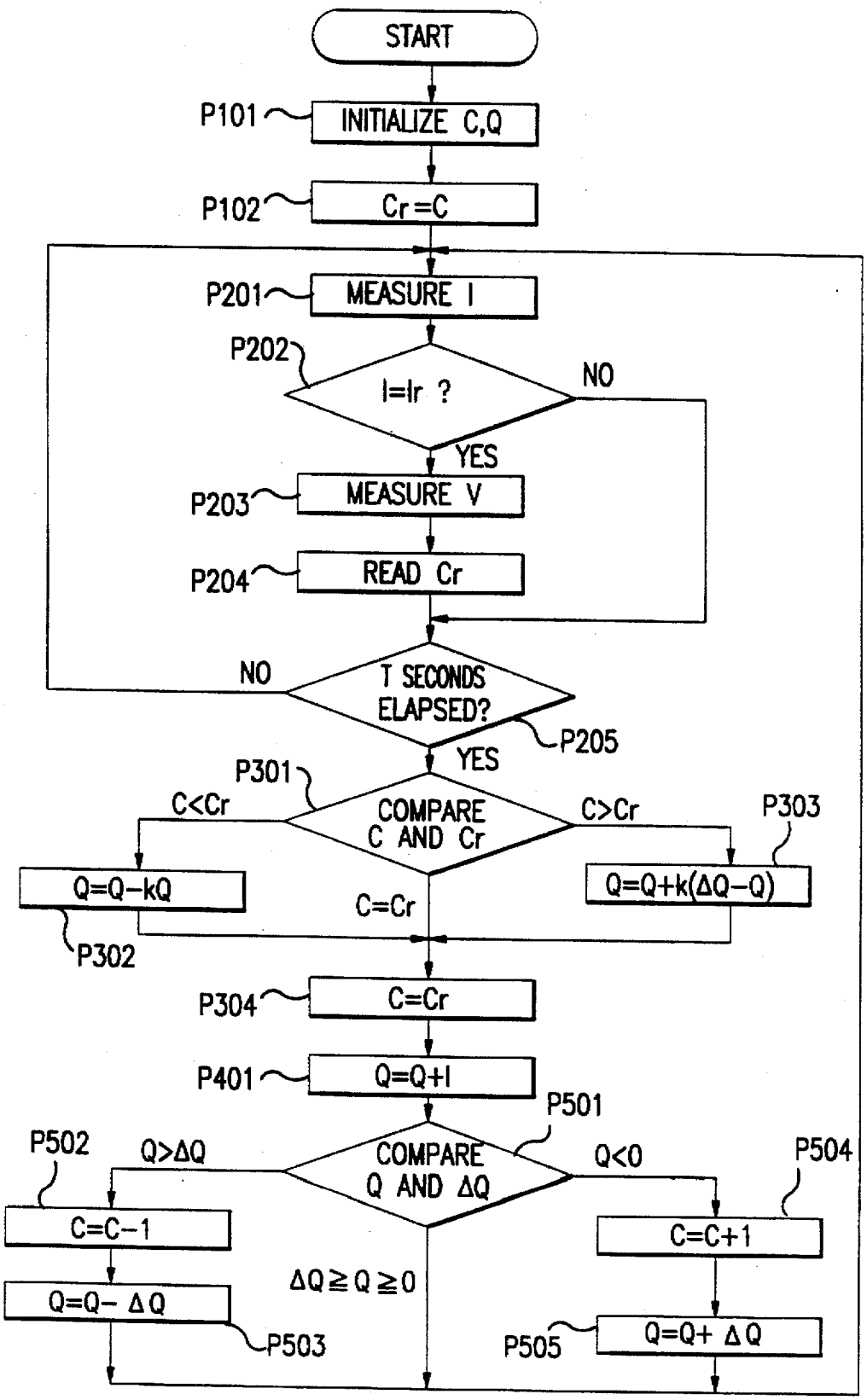
FIG. 11 is a flowchart showing computation steps of the remaining battery capacity computation method according to a second embodiment of the present invention.

Therefore, in the second embodiment, the process routines of steps P501 through P505 as shown in FIG. 11 replace the processes following step P401 in the flowchart of FIG. 7. In other words, when significant battery charging occurs during vehicle operation, an additional procedure allows the capacity display value C to increase accordingly to accurately reflect presently remaining battery capacity.

Accordingly, in the second embodiment, the processes from step P101 through step P304 are identical with those performed with respect to the first embodiment.

Because during battery charging by the regenerative brake there are no cases where the discharge electric current I from the battery to the motor matches the specific electric current Ir, there is no need to reset the detected remaining capacity value Cr, and the correction process described further above is not conducted.

In other words, in step P401, the discharge electric current I is added to the accumulated electric current value Q in a manner similar to that described above with regard to the first embodiment. However, when charging is performed through the regenerative braking or the like, the discharge electric current I becomes negative, and consequently when the charging state is maintained for a long period of time, the accumulated electric current value Q to which the discharge electric current I of negative value has been repeatedly added also becomes a negative value.

Furthermore, in step P501, the electric current accumulation value Q is compared to the interval total current value ΔQ, and the flowchart branches in three direction depending on the results of this comparison.

In other words, similar to the above-described embodiment, in step P501 when the electric current accumulation value Q is determined to be greater than the interval total current value ΔQ, the flowchart moves to the processes in steps P502 and P503, wherein the display level value C is lowered one level and the electric current accumulation value Q is reset in accordance with the new display level interval. Following the execution of steps P502 and P503, the flowchart returns to step P201.

Alternatively, when in step P501 the electric current accumulation value Q is determined to be less than or equal to the interval total current value ΔQ and greater than or equal to 0, the flowchart returns directly to step P201 without conducting any resetting process.

Furthermore, when the battery is charged for a long period of time by a regenerative brake or the like in step P501 and the electric current accumulation value Q is a negative value that is less than 0, the flowchart moves to steps P504 and P505, wherein the display level value C is raised one level and the electric current accumulation value Q is reset in accordance with the display level interval of the previous level. Following the execution of steps P504 and P505, the flowchart returns to step P201.

Figure 12:
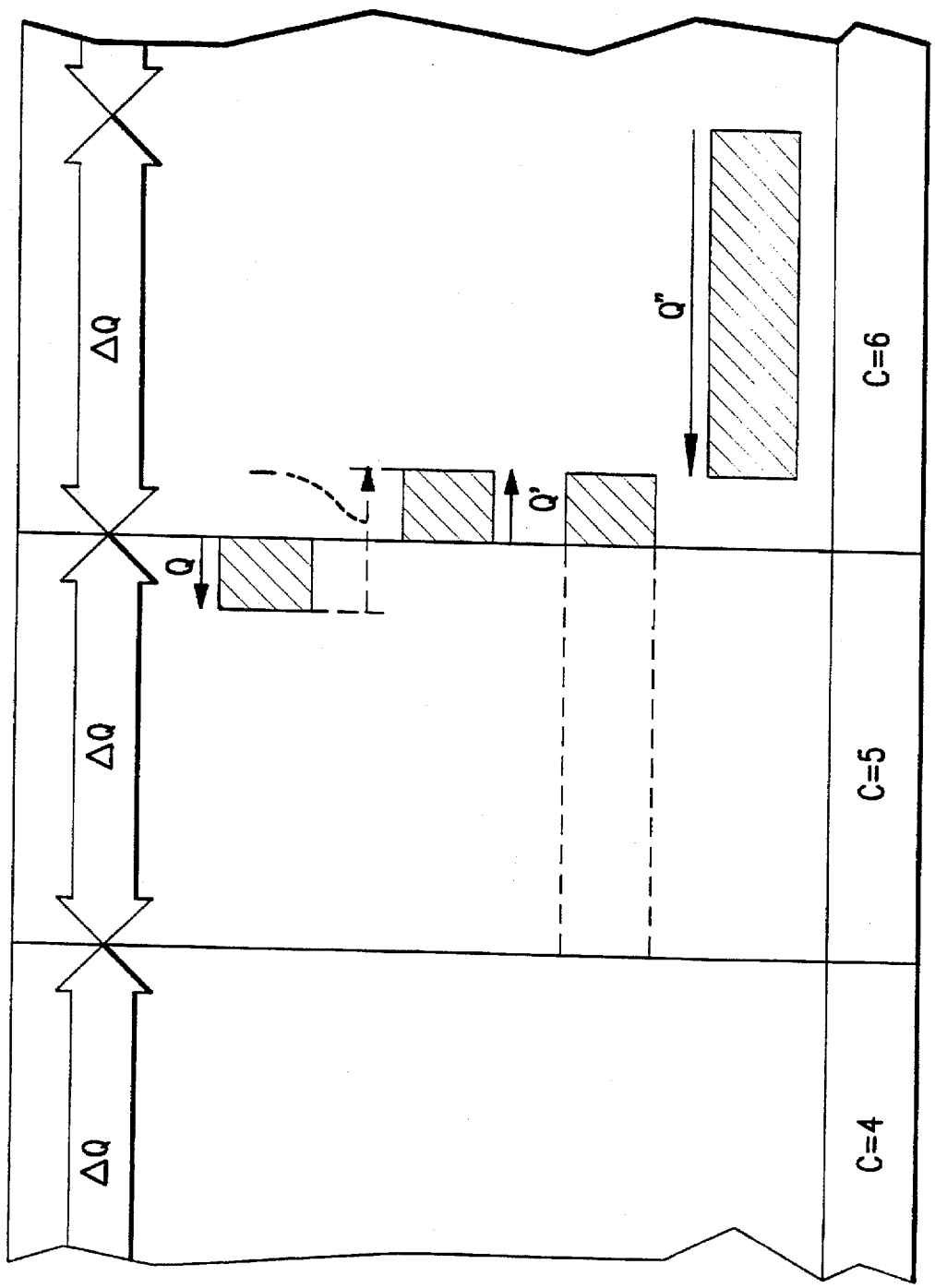
FIG. 12 is an explanatory diagram showing the display update process through the accumulation operation of the battery charging time in the second embodiment.

For example, as shown in the top level of FIG. 12, a negative electric current value I, which indicates the charging electric current and which is shown by the broken line in FIG. 12, is added to the electric current accumulation value Q in the fifth display level interval, and thereby the electric current accumulation value Q becomes an electric current accumulation value Q' which is less than 0, as indicated in the middle level of FIG. 12, and the accumulation value position of the electric current accumulation value Q' exceeds the interval boundary and extends into the sixth display level interval (corresponding to the state upon completion of step P401). Thus, a determination is made in step P501 that this state is present, and in step P504, the capacity display value C increases by one level, and the display level rises from 5 to 6. Next, in step P505, the interval total current value ΔQ is added to the electric current accumulation value Q' to generate the electric current accumulation value Q", as shown in the bottom level of FIG. 12. Q" is thereby set within the sixth display level interval.

Accordingly, battery capacity which has been increased by charging is reflected in the remaining battery capacity displayed by the display unit. Because increases and decreases in the value displayed by the display unit match the rise and fall in the actual remaining battery capacity without fail, correction of the electric current accumulation value Q does not cause the value displayed by the display unit to change unnaturally.

As described above, with the remaining battery capacity meter 1 of the second embodiment, not only are similar results achieved as in the first embodiment, but the meter's versatility is increased so that it is possible to use the meter in a device in which charging and discharging occur during battery usage through a regenerative brake or the like in an electric vehicle.

In both of the above-described embodiments, when the value of the capacity display value C is at the maximum 10, the capacity display value C is never smaller than the detected remaining capacity value Cr, and accordingly, in the case of the level 10 display, correction in the direction which decreases the electric current accumulation value Q is not conducted even if charging is conducted. Because this problem is easy to resolve, the method thereof will be briefly described. In other words, when leaving the display unit 11 in the level 10 display state, it is preferable to totally, or only partially in the level 10 display, make the capacity values C and Cr more detailed. By so doing, even if the external display is in a level 10 state, the correction process is conducted internally. In other words, even if the indicated value shown by the display unit 11 is at the maximum 10, a detailed correction process is always conducted inside the microcomputer 8. Naturally, changes in the details of these embodiments also fall within the scope of the present invention.

Furthermore, in the above-described embodiments, the accumulation of electric current measurement is an objective, but it would also be appropriate to target terminal voltages and to accumulate electric power measurements. It would also be appropriate for the data table stored in the ROM to be data corresponding to specific discharge terminal voltages that are measured at a fixed electric power discharge rate.

In addition, it is also possible to boost precision by preparing a plurality of data tables and interval total current values ΔQ corresponding to differing discharge electric currents, discharge electric powers or temperatures. In other words, because the discharge performance of the battery changes by 10% to 20% depending on the temperature conditions, it is possible to prepare beforehand data tables and interval total current values ΔQ corresponding to the battery discharge curves that change with each temperature, and to provide a temperature sensor near the battery so that the table and setting values are reset to values that are suitable for the temperature which is detected, thereby boosting the precision of the remaining battery capacity meter 1. For example, in the case of a battery used in an electric vehicle, during low temperature conditions as in winter, the battery is at low temperatures and the total dischargeable capacity falls sharply. However, by appropriately switching to a data table and interval total current ΔQ in accordance with the battery temperature change, it is possible to cope with this situation.

All of these variations are included in the scope of the present invention.

With the remaining battery capacity meter and the remaining capacity detection method of the present invention, when the discharge current or discharge power matches a certain predetermined value or is in the proximity thereof, the remaining capacity recorded in a data table beforehand is read in accordance with the value of the present terminal voltage, and a correction is applied to the accumulated value computation of the electric current or power. Through this method, it is possible to control accumulation of errors even without a high precision detection circuit. Moreover, because the amount of the correction is restricted to the range wherein the display of the display unit does not change, it is possible to avoid unnatural changes in the displayed remaining battery capacity value such as a dramatic decrease or an increase during battery discharge, so that the increases or decreases in the step of the display match the increases or decreases in the actual remaining battery capacity to the very end. Consequently, it is possible to guarantee high reliability while maintaining merits in the accumulation type remaining battery capacity meter.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A remaining battery capacity meter, wherein a) the accumulated amount of electric current or electric power from a battery is computed and used to compute a corresponding remaining battery capacity, and b) the computed remaining battery capacity is displayed, comprising:

display means for displaying the computed remaining battery capacity;

memory means for storing at least one data table relating a terminal voltage of the battery at a predetermined discharge current or discharge power to a remaining capacity of the battery;

detection means for detecting when a discharge current or discharge power of the battery approximately matches the predetermined discharge current or discharge power;

reading means for reading the remaining capacity relating to the terminal voltage from the data table when the detection means detects that the discharge current or discharge power of the battery approximately matches the predetermined discharge current or discharge power; and correction means for recognizing a difference between the remaining capacity read by the reading means from the data table and the computed remaining battery capacity displayed on the display means, and correcting the computed remaining battery capacity according to the difference.

2. The remaining battery capacity meter of claim 1, wherein the correction means corrects the computed remaining battery capacity by increasing or decreasing the computed accumulated amount.

3. The remaining battery capacity meter of claim 1, wherein the display means displays the computed remaining battery capacity in increments.

4. The remaining battery capacity meter of claim 3, wherein the correction means corrects the computed remaining battery capacity according to the difference and within a range, so that the displayed computed remaining battery capacity increment does not change.

5. A remaining battery capacity meter, wherein a) an accumulated amount of electric current or electric power from a battery is computed and used to compute a corresponding remaining battery capacity, and b) the computed remaining battery capacity is displayed, comprising:

a display unit on which the computed remaining battery capacity is displayed;

a memory unit having at least one data table relating a terminal voltage of the battery at a predetermined discharge current or discharge power to a remaining capacity of the battery;

a detection unit for detecting when a discharge current or discharge power of the battery approximately matches the predetermined discharge current or discharge power;

a reading unit that reads the remaining capacity relating to the terminal voltage from the data table when the detection unit detects that the discharge current or discharge power of the battery matches, or is in the proximity of, the predetermined discharge current or discharge power; and a correction unit that recognizes a difference between the remaining capacity read by the reading unit from the data table and the computed remaining battery capacity displayed on the display unit, and increasing or decreasing the computed remaining battery capacity according to the difference.

6. The remaining battery capacity meter of claim 5, wherein the correction unit corrects the computed remaining battery capacity by increasing or decreasing the computed accumulated amount.

7. The remaining battery capacity meter of claim 5, wherein the display unit displays the computed remaining battery capacity in increments.

8. The remaining battery capacity meter of claim 7, wherein the correction unit corrects the computed remaining battery capacity according to the difference and within a range, so that the displayed computed remaining battery capacity increment does not change.

9. A method for computing remaining battery capacity of a battery using an accumulation type remaining battery capacity meter having at least one data table relating a terminal voltage of the battery at a predetermined discharge current or discharge power to a remaining capacity value of the battery, comprising:

measuring a discharge of electric current or electric power from the battery over time;

computing a cumulative amount of the electric current or electric power discharged from the battery;

computing a remaining battery capacity corresponding to the computed cumulative amount of the discharged electric current or electric power;

displaying the computed remaining battery capacity in increments;

measuring a terminal voltage of the battery;

using the measured terminal voltage to retrieve a corresponding remaining battery capacity value from the data table when electric current or power presently discharged from the battery approximately matches a predetermined electric current or power discharge value;

correcting the computed remaining battery capacity according to a difference between the corresponding remaining battery capacity value read from the data table and the computed remaining battery capacity presently being displayed; and limiting the correction of the computed remaining battery capacity to a range, wherein the computed remaining battery capacity increment being displayed does not change.

10. The method of claim 9, further comprising correcting the computed remaining battery capacity by correcting the cumulative amount of the discharged electric current or electric power.

* * * * *